(12) United States Patent
Shaviv et al.

(10) Patent No.: US 10,622,252 B2
(45) Date of Patent: Apr. 14, 2020

(54) CO OR NI AND CU INTEGRATION FOR SMALL AND LARGE FEATURES IN INTEGRATED CIRCUITS

(71) Applicant: APPLIED Materials, Inc., Santa Clara, CA (US)

(72) Inventors: Roey Shaviv, Palo Alto, CA (US); Ismail T. Emesh, Sunnyvale, CA (US)

(73) Assignee: APPLIED Materials, Inc., Santa Clara, CA (US)

(*) Notice: Subject to any disclaimer, the term of this patent is extended or adjusted under 35 U.S.C. 154(b) by 0 days.

(21) Appl. No.: 15/798,168

(22) Filed: Oct. 30, 2017

(65) Prior Publication Data

US 2018/0122696 A1    May 3, 2018

Related U.S. Application Data

(62) Division of application No. 14/991,712, filed on Jan. 8, 2016, now Pat. No. 9,805,976.

(51) Int. Cl.
*H01L 21/768* (2006.01)
*H01L 23/532* (2006.01)
*H01L 21/288* (2006.01)

(52) U.S. Cl.
CPC .. *H01L 21/76879* (2013.01); *H01L 21/76843* (2013.01); *H01L 21/76862* (2013.01); *H01L 21/76864* (2013.01); *H01L 21/76873* (2013.01); *H01L 21/76877* (2013.01);
(Continued)

(58) Field of Classification Search
CPC ......... H01L 21/76879; H01L 23/53238; H01L 21/76843; H01L 21/76883; H01L 21/76873; H01L 21/76864; H01L 21/76862; H01L 21/76877; H01L 23/53209; H01L 21/2885; H01L 21/0228; H01L 21/28194; H01L 21/28556; H01L 21/304; H01L 21/76838; H01L 21/76876
See application file for complete search history.

(56) References Cited

U.S. PATENT DOCUMENTS

| 5,227,041 A | 7/1993 | Brogden et al. |
| 7,645,366 B2 | 1/2010 | Hanson et al. |
| 2004/0087148 A1 | 5/2004 | Wong |

(Continued)

FOREIGN PATENT DOCUMENTS

JP    2010-212601 A    9/2010

OTHER PUBLICATIONS

International Search Report and Written Opinion dated Apr. 20, 2017, issued in corresponding international application No. PCT/US2016/062583, filed Nov. 17, 2016, 13 pages.

(Continued)

*Primary Examiner* — Niki H Nguyen
*Assistant Examiner* — Juanita B Rhodes
(74) *Attorney, Agent, or Firm* — Christensen O'Connor Johnson Kindness PLLC

(57) ABSTRACT

In one embodiment of the present disclosure, a microfeature workpiece includes at least two features of two different sizes disposed in a dielectric, wherein a width of a first feature is less than or equal to 17 nm and wherein the first feature is filled with cobalt or nickel, and wherein a width of a second feature is greater than 20 nm and wherein the second feature is filled with a stack layer of cobalt or nickel and copper.

22 Claims, 14 Drawing Sheets

(52) U.S. Cl.
CPC .. *H01L 21/76883* (2013.01); *H01L 23/53209* (2013.01); *H01L 23/53238* (2013.01); *H01L 21/2885* (2013.01)

(56) References Cited

U.S. PATENT DOCUMENTS

| | | |
|---|---|---|
| 2008/0280151 A1 | 11/2008 | Jourdan et al. |
| 2009/0017227 A1 | 1/2009 | Fu et al. |
| 2012/0091593 A1* | 4/2012 | Cheng ................ H01L 21/743 257/774 |
| 2013/0127055 A1* | 5/2013 | Chen ................. H01L 23/53238 257/751 |
| 2013/0134035 A1 | 5/2013 | Harris et al. |
| 2013/0140698 A1* | 6/2013 | Lakshmanan ..... H01L 21/76843 257/751 |
| 2014/0183738 A1* | 7/2014 | Jezewski ............... H01L 23/485 257/751 |
| 2014/0287577 A1* | 9/2014 | Emesh .............. H01L 21/76879 438/618 |
| 2014/0291847 A1* | 10/2014 | Zhang ............... H01L 23/53261 257/751 |
| 2015/0270133 A1 | 9/2015 | Lam et al. |

OTHER PUBLICATIONS

Lane, M.W., et al., "Relationship Between Interfacial Adhesion and Electromigration in Cu Metallization," Journal of Applied Physics, (93)3: 1417-1421, Feb. 1, 2003.

Savari, R., et al., "Impact of Size Effects on the Resistivity of Copper Wires and Consequently the Design and Performance of Metal Interconnect Networks," Interconnect Technology Conference, IEEE Electron Devices Society, Burlingame, CA, Jun. 6-8, 2005, pp. 197-199.

International Preliminary Report on Patentability mailed Jul. 19, 2018, issued in corresponding International Application No. PCT/US2016/062583, filed Nov. 17, 2016, 10 pages.

* cited by examiner

CO OR NI AND CU INTEGRATION FOR SMALL AND LARGE FEATURES IN INTEGRATED CIRCUITS

CROSS-REFERENCE TO RELATED APPLICATION

This application is a division of U.S. patent application Ser. No. 14/991,712, filed Jan. 8, 2016, to be issued as U.S. Pat. No. 9,805,976 on Oct. 31, 2017, the disclosure of which is hereby expressly incorporated by reference herein in its entirety.

BACKGROUND

Integrated circuits (IC) include various semiconductor devices formed within or on layers of dielectric material that overlay a substrate. The devices formed in or on the dielectric layers may include MRS transistors, bipolar transistors, diodes, and diffused resistors. Other devices formed in or on the dielectric material may include thin film resistors and capacitors. Metal lines interconnect the semiconductor devices to power the devices and enable the devices to share and exchange information. Interconnects may extend horizontally between devices within a dielectric layer as well as vertically between dielectric layers. These metal lines are connected to each other by a series of interconnects. The electrical interconnects or metal lines are first patterned into the dielectric layers to form vertical and horizontal recessed features (vias and trenches) that are subsequently filled with metal. The resulting layer containing metal-filled lines residing in a dielectric is referred to as a metallization layer.

A long-standing objective in the advancement of IC technology has been the scaling down of IC dimensions. Scaling-down of IC dimensions is critical to obtaining higher speed performance of ICs. An increase in IC performance is normally accompanied by a decrease in device area and/or an increase in device density. An increase in device density results in a decrease in via and trench dimensions (widths) used to form interconnects. However, as feature dimensions on wafers decrease, negative consequences may occur. For example, reduced-size features may result in less reliable interconnects.

Copper interconnects are typically used in ICs. However, drawbacks of copper interconnects in small features include performance as a result of, for example, voids formed during deposition, electromigration tendencies of copper, line resistance, and via resistance. Therefore, there exists a need for the integration of copper and non-copper interconnects, the metal for a feature being selected depending on the size of the feature. Embodiments of the present disclosure are directed to an integration scheme for Cu and other metal interconnects to solve these and other problems.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a microfeature workpiece is provided. The workpiece includes a dielectric having at least two features, wherein the critical dimension of the first feature is less than or equal to 17 nm and is filled with cobalt or nickel, and wherein the critical dimension of the second feature is greater than 20 nm and is filled with a stack layer of cobalt or nickel and copper.

In accordance with one embodiment of the present disclosure, a microfeature workpiece is provided. The workpiece includes at least two features of two different sizes disposed in a dielectric, wherein a width of a first feature is less than or equal to 17 nm and wherein the first feature is filled with cobalt or nickel, and wherein a width of a second feature is greater than 20 nm and wherein the second feature is filled with a stack layer of cobalt or nickel and copper, wherein the microfeature workpiece is formed by electrochemically depositing a second metal layer after a first metal layer on the workpiece, wherein the second metal layer is a copper layer and wherein the first metal layer includes a metal selected from one of a group consisting of cobalt and nickel, wherein the first metal layer completely fills the first feature of the at least two features but does not completely fill the second feature of the at least two features.

In any of the embodiments described herein, the workpiece may include an adhesion or barrier layer in the at least two features between the dielectric and the cobalt or nickel layer.

In any of the embodiments described herein, the workpiece may have been heat treated.

In any of the embodiments described herein, the metal in the first feature may have been reflowed.

In any of the embodiments described herein, the metal in the first and second features may have been reflowed.

In any of the embodiments described herein, the first and second features may include an overburden.

In any of the embodiments described herein, a method may further include heat treating the workpiece after deposition of the second metal layer.

In any of the embodiments described herein, the temperature for heat treating e workpiece may be in the temperature range of 150 degrees C. to 400 degrees C.

In any of the embodiments described herein, heat treating the workpiece may anneal the first and second metal layers.

In any of the embodiments described herein, heat treating the workpiece may reflow the second metal layer to at least partially fill the largest feature.

In any of the embodiments described herein, a method may further include plasma treating the first metal layer using hydrogen plasma or hydrogen radicals (H*) prior to electrochemically depositing the second metal layer.

In any of the embodiments described herein, a method may further include heat treating the first metal layer before depositing the second metal layer.

In any of the embodiments described herein, heat treating the first metal layer may be in the temperature range of 200 degrees C. to 400 degrees C.

In any of the embodiments described herein, the second metal layer may be a conformal or superconformal layer.

In any of the embodiments described herein, the second metal layer may be a bottom-up fill layer.

In any of the embodiments described herein, the second metal layer may include an overburden.

In any of the embodiments described herein, the second metal layer may at least partially fill the largest feature without depositing an overburden on the workpiece.

In any of the embodiments described herein, a method may further include electrochemically depositing a third metal layer on the second metal layer.

In any of the embodiments described herein, the third metal layer may be an overburden, a cap, a fill layer, a conformal conductive layer, or a superconformal conductive layer.

In any of the embodiments described herein, a method may further include CMP.

In any of the embodiments described herein, a method may further include heat treating the workpiece after CMP.

In any of the embodiments described herein, the first metal layer may be a first seed layer.

In any of the embodiments described herein, the first seed layer may be deposited by a process selected from the group consisting of physical vapor deposition, chemical vapor deposition, atomic layer deposition, and electro-less deposition.

In any of the embodiments described herein, a method may further include a second seed layer on the first seed layer prior to deposition of the second metal layer.

In any of the embodiments described herein, the second seed layer may be different in metal composition from the first seed layer.

In any of the embodiments described herein, the second seed layer may be a copper seed layer.

In any of the embodiments described herein, the second seed layer may be deposited by a process selected from the group consisting of physical vapor deposition, chemical vapor deposition, atomic layer deposition, and electro-less deposition.

In any of the embodiments described herein, the workpiece may include an adhesion or barrier layer deposited in the feature prior to deposition of the seed layer.

In any of the embodiments described herein, the second metal layer may be deposited over the entire surface of the seed layer.

wherein the workpiece includes an adhesion or barrier layer deposited in the features prior to deposition of the cobalt or nickel layer.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein.

DETAILED DESCRIPTION

Figure 1A:
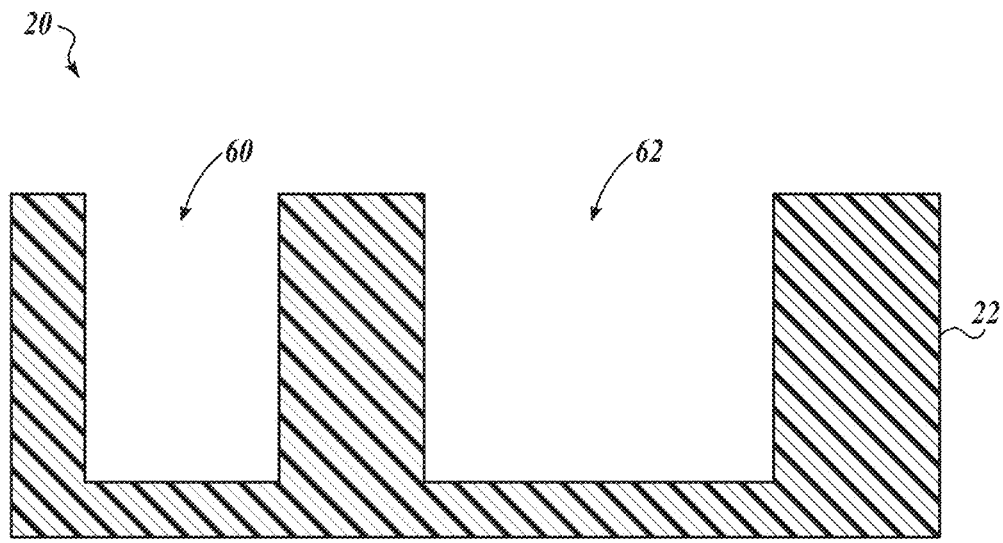
FIGS. 1A-1F are a series of schematic illustrations of a method of forming a interconnects in accordance with one embodiment of the present disclosure.

The present disclosure relates to methods and integration for hybrid non-copper (such as cobalt and nickel) and copper metallization layers in some larger features (such as trenches, particularly in Damascene applications) of a microelectronic workpiece and non-copper metallization layers in other smaller features (such as vias, particularly in Damascene applications) of a microelectronic workpiece.

In one exemplary embodiment, one small feature on a workpiece having a critical dimension of less than or equal to 17 nm is filled with cobalt or nickel metallization, and another feature on a workpiece having a critical dimension of greater than 20 nm is filled with a hybrid of cobalt or nickel and copper metallization. In another exemplary embodiment, one small feature on a workpiece having a critical dimension of less than or equal to 15 nm is filled with cobalt or nickel metallization, and another feature on a workpiece having a critical dimension of greater than 20 nm is filled with a hybrid of cobalt or nickel and copper metallization.

Embodiments of the present disclosure are directed to workpieces, such as semiconductor wafers, devices or processing assemblies for processing workpieces, and methods of processing the same. The terms "workpiece," "wafer," and "semiconductor wafer" means any flat media or article, including semiconductor wafers and other substrates or wafers, glass, mask, and optical or memory media, MEMS substrates, or any other workpiece having micro-electric, micro-mechanical, or microelectro-mechanical devices.

Methods described herein are to be used for metal or metal alloy deposition in features of workpieces, including trenches and vias. In one embodiment of the present disclosure, the process may be used in "small" features, for example, features having a feature critical dimension of less than 20 nm. The dimension sizes discussed in the present application may be post-etching feature dimensions at the top opening of the feature. In one embodiment of the present disclosure, small Damascene features may have a minimum dimension size of less than or equal to 17 nm. In another embodiment, small Damascene features may have a minimum dimension size of less than or equal to 15 nm.

In other embodiments, "large" Damascene features as described in the present disclosure may have a minimum dimension size of greater than 20 nm.

The processes described herein may be applied to various forms of cobalt, nickel, copper, and alloys, for example, in Damascene applications.

The descriptive terms "micro-feature workpiece" and "workpiece" as used herein may include all structures and layers previously deposited and formed at a given point in the processing, and is not limited to just those structures and layers as depicted in the figures. For example, larger features may be present on the workpieces in accordance with standard semiconductor procedure and manufacture.

Although generally described as metal deposition in the present application, the term "metal" also contemplates metal alloys and co-deposited metals. Such metals, metal alloys, and co-deposited metals may be used to form seed layers or to fully or partially fill the feature. As a non-limiting example in co-deposited metals and metal alloys, the alloy composition ratio may be in the range of about 0.5% to about 6% secondary alloy metal.

With reference to FIGS. 1A-1F, an integration scheme for filling one or more features using cobalt and copper to form exemplary interconnects will now be described. As a non-limiting example, the series of layers in a workpiece 20 typically include a dielectric layer 22 (see FIG. 1A), an optional adhesion layer 28 (see FIG. 1B), a first metal layer 30, for example a seed layer (see FIG. 1C), and a second metal layer 32, for example, a conformal electrochemically deposited metallization layer (see FIG. 1D).

The integration scheme is illustrated for two features of two different sizes in the dielectric layer 22, shown as a first small feature 60 and a second larger feature 62 (see FIG. 1A). Although only illustrated as including two features, a workpiece having any number of features is within the scope of the present disclosure, so long as there is at least one small feature 60 and at least one large feature 62.

Figure 1B:
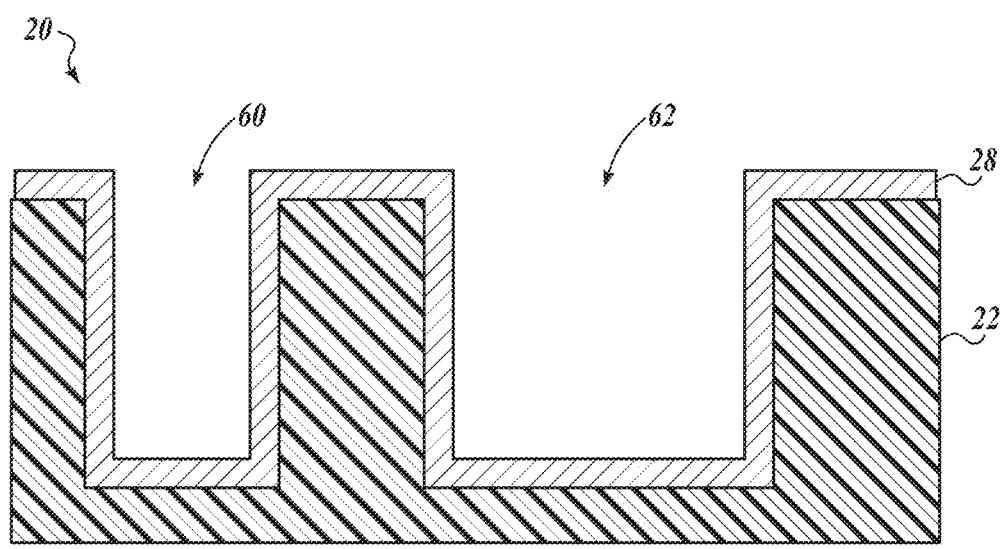

Referring to FIG. 1B, an optional adhesion (or barrier) layer 28 on the dielectric material may include, for example, titanium (Ti), tantalum (Ta), titanium nitride (TiN), tantalum nitride (TaN), etc. As a non-limiting example, the adhesion layer may be a TiN layer formed by a CVD or an ALD process. In some applications, an adhesion layer may not be needed.

Figure 1C:
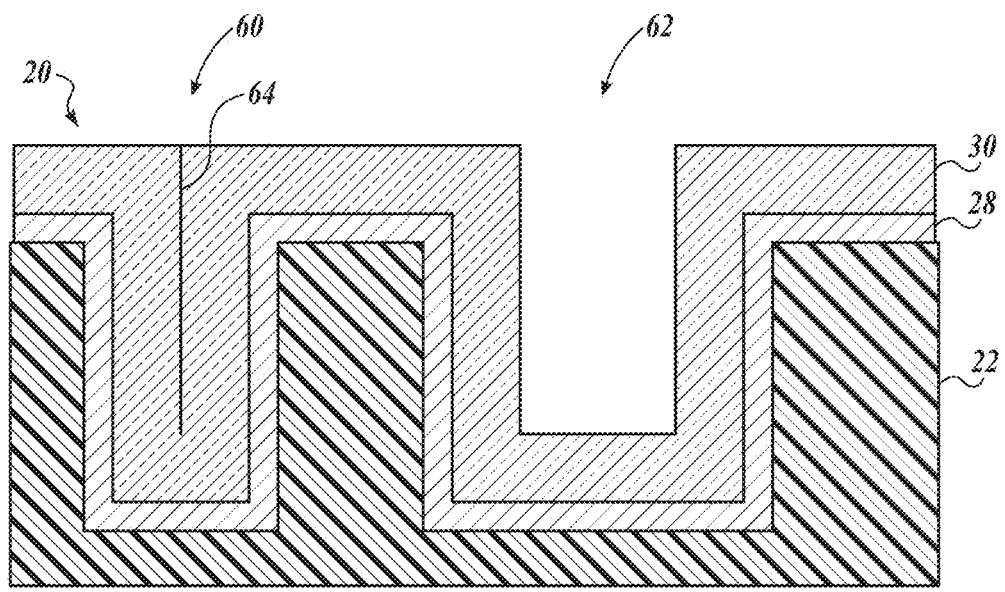

Referring to FIG. 1C, the first metal layer 30 is a seed layer deposited on the adhesion layer 28, or directly on the dielectric layer 22 if there is no adhesion layer. In accordance with embodiments of the present disclosure, the seed layer is, for example, formed from Co or Ni by a CVD process. Although commonly formed by a CVD process, the seed layer may also be formed by using other deposition techniques, such as ALD, PVD, or electro-less deposition. The first metal layer 30 may also be a stack film including a seed layer and a liner layer (not shown).

In the illustrated embodiment, the first metal layer 30 fills the smaller feature 60, but does not fill the larger feature 62. As can be seen in FIG. 1C, the thickness of the first metal layer 30 may be equal to or greater than the ½ opening after deposition of the barrier or liner layer 28 in the small feature 60 on the workpiece 20. In the illustrated embodiment, a seam 64 is formed in the small feature 60 where the two sides of the conformal first metal layer 30 come together. The first metal layer 30 may have a film thickness of half the width of the feature 60 to fill an opening having that critical dimension, for example, in the range of about 5 nm to about 50 nm.

In another embodiment of the present disclosure, the first metal layer 30 may be thin enough to leave all features open and not filling even the small feature 60 on the workpiece. In another embodiment of the present disclosure, the first metal layer 30 may fill all the features (large and small) on the workpiece.

In the illustrated embodiment of FIGS. 1A-1F, the first metal layer 30 is not annealed immediately following deposition. However, in other embodiments, the first metal layer 30 may be optionally annealed following deposition, as described in greater detail below. Such annealing may be advantageous for healing the seam 64 (see FIG. 1C), sealing micro-voids, stabilizing the film, densifying the film, lowering the resistivity of the film, and promoting crystal growth.

In some cases, annealing of a first metal layer 30 may be at a suitable temperature to cause a reflow of the first metal layer 30. In other cases, the anneal may be performed at a lower temperature without reflowing the first metal layer 30.

In some cases, the first metal layer 30 may be annealed to lower sheet resistance prior to ECD deposition of the second metal layer 32.

After annealing, the thickness of the first metal layer 30 may be reduced, for example, in the range of about 2 nm to about 35 nm.

Annealing conditions for the first metal layer 30 may be in a temperature range of 200 C to 400 C, and a pressure between 1 mTorr and 1 atm. In addition, a vacuum anneal is also within the scope of the present disclosure. The annealing environment may be hydrogen, a hydrogen/helium mix (e.g., 4% hydrogen, 96% helium), or a hydrogen/nitrogen mix (e.g., 4% hydrogen, 96% nitrogen).

Figure 1D:
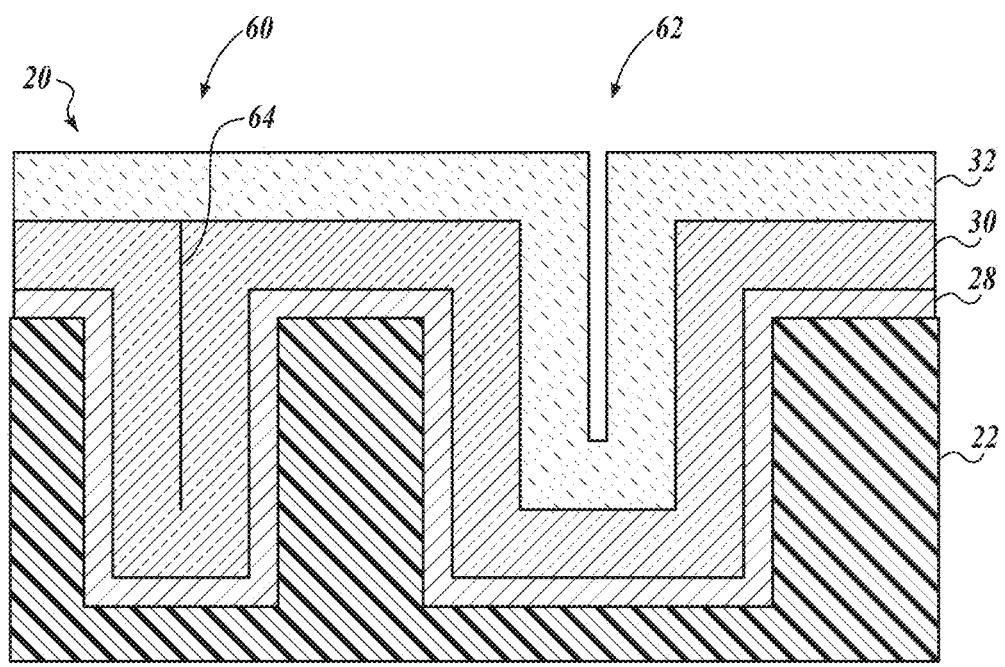

After deposition (and optional anneal) of the first metal layer 30, a second metal layer 32 is electrochemically deposited, as seen in FIG. 1D. In one embodiment of the present disclosure, the second metal layer 32 is an ECD Cu layer. The ECD Cu layer may have a film thickness in the range of about 50 nm and about 500 nm.

Thin seed layers or seed layers made from metals other than copper tend to have high sheet resistance, which can lead to overheating of the workpiece where electrical connection is made during the electrochemical deposition process. Therefore, the second metal layer 32, for example, an ECD Cu layer, may be plated using contacts immersed in the plating solution and thus, the second metal layer 32 is deposited on a first metal layer 30 (or seed layer) over the entire surface of the workpiece.

In the illustrated embodiment of FIG. 1D, the second metal layer 32 is a conformal layer. However, the ECD second metal layer 32 may be a conformal layer, a super-conformal layer, or a bottom-up fill layer, for example, deposited using conventional acid chemistry.

In one non-limiting example, the second metal layer 32 is an ECD Cu layer is deposited using an alkaline chemistry including a very dilute copper ethylenediamine (EDA) complex. ECD copper may also be deposited using other copper complexes, such as citrate, tartrate, glycine, ethylenediaminetetraacetic acid (EDTA), urea, etc., and may be deposited in a pH range of about 2 to about 11, about 3 to about 10, about 4 to about 10, or in a pH range of about 6 to about 10. In one embodiment of the present disclosure, the ECD copper alkaline chemistry may have a mildly acidic, neutral, or alkaline pH, for example in the range of about 6.5 to 9.3. In addition, the copper electrolyte includes a source of copper ions, such as copper chloride or copper sulfate, and may include a complexing agent, such as glycine or EDA.

In another non-limiting example, the electrolyte may include one or more components, such as organic additives and/or complexing agents, and a pH range of about 6 to about 13 to achieve super-conformal fill.

Conventional ECD copper acid chemistry may include, for example, copper sulfate, sulfuric acid, methane sulfonic acid, hydrochloric acid, and organic additives (such as accelerators, suppressors, and levelers). ECD deposition provides a substantially bottom up (e.g., nonconformal) metal fill. Acid chemistry may dissolve some of the cobalt seed layer (up to 40 Angstroms). Therefore, the use of conventional ECD copper acid chemistry includes consideration of the potential dissolution.

In some exemplary embodiments of the present disclosure, deposition current density for ECD can range from 1 $mA/cm^2$ to 6 $mA/cm^2$ for dilute chemistry or from 1 mA/cm2 to 30 mA/cm2 for more concentrated chemistry. The waveform for applied current during deposition can be either direct current or pulsed current. Temperature during ECD can range between 15 to 40 degrees Celsius.

Figure 1E:
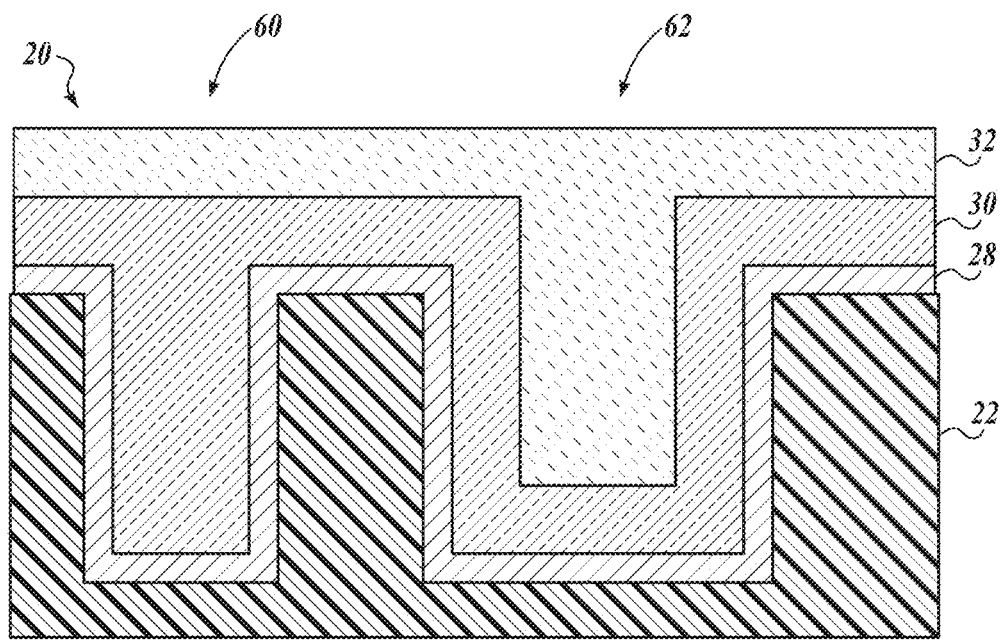

As seen in comparing FIG. 1D with FIG. 1E, the workpiece 20 may be optionally heat treated or annealed after deposition of the second metal layer 32. As mentioned above, annealing can provide one or more of the advantageous effects of healing the seam 64 of the first metal layer 30 in the small feature 60, sealing micro-voids, stabilizing the film, densifying the film, lowering the resistivity of the film, and promoting crystal growth.

As a not limiting example, resistivity for a cobalt seed layer as a first metal layer 30 may be in the range of about 8 to about 12 μ106 ·cm post anneal. In contrast, the bulk resistivity for a copper layer as the second metal layer 32 may be about 25% of cobalt resistivity. However, in narrow features, copper resistivity may exceed the resistivity of cobalt. Annealing may help to reduce the resistivity of the first and/or second layers 30 and 32. In some cases, annealing may cause a reflow of the first and/or second metal layers 30 and 32, for example, as seen in the larger feature 62 of FIG. 1E. Reflow of the second metal layer 32 may cause partial or full fill of the larger feature 62.

Annealing conditions for the workpiece 20 after deposition of the second metal layer 32 may be in a temperature range of 150 C to 400 C, and a pressure between 1 mTorr and 1 atm. In addition, a vacuum anneal is also within the scope of the present disclosure. The annealing environment may be hydrogen, a hydrogen/helium mix (e.g., 4% hydrogen, 96% helium), or a hydrogen/nitrogen mix (e.g., 4% hydrogen, 96% nitrogen). The time for the annealing process may be in the range of about 1 to about 60 minutes.

If the line is wide, cobalt and nickel are not effective metal conductors because of resistance. Instead, a copper conductor is needed to carry the current in the wide line. If the line or the via is narrow and short, for example, having a width of less than or equal to 17 nm and a length of less than 3 microns, cobalt or nickel will be an effective, low resistance metal conductor. Therefore, the inventors have found features having a critical dimension of less than 17 nm or narrower have better performance if the conductor is made of Co or Ni, and not Cu. Still yet, features wider than 20 nm perform better if the conductor is made of Cu. Therefore, embodiments of the present disclosure are directed to an integration scheme for Co and/or Ni and Cu features on a single workpiece.

In the illustrated embodiment of FIGS. 1A-1F, the ECD Cu process completely fills all features (small and large) leaving an overburden on the field. Therefore, the post plating anneal process in FIG. 1E anneals the overburden metal in addition to the metal filling the feature, which may promote crystal growth, stabilize and lower the resistivity of the films, and seal any remaining microvoids and seams.

In accordance with embodiments of the present disclosure, an ECD electrolyte for conformal or super-conformal fill or a conventional acidic ECD electrolyte for bottom up can be used for either full or partial fill of some of the features, or overburden deposition, or both, in one or two deposition steps or more, as needed. For example, a third metal layer (not shown), may be deposited to fill the large feature 62 or to deposit an overburden on the workpiece.

As a non-limiting example, the thickness of the ECD Cu metallization layer in an exemplary first metallization step may be in the range of about 10 nm to about 50 nm. Further as a non-limiting example, the thickness of the ECD Cu metallization layer in an exemplary second metallization and/or overburden step may be in the range of about 100 nm to about 500 nm.

Figure 1F:
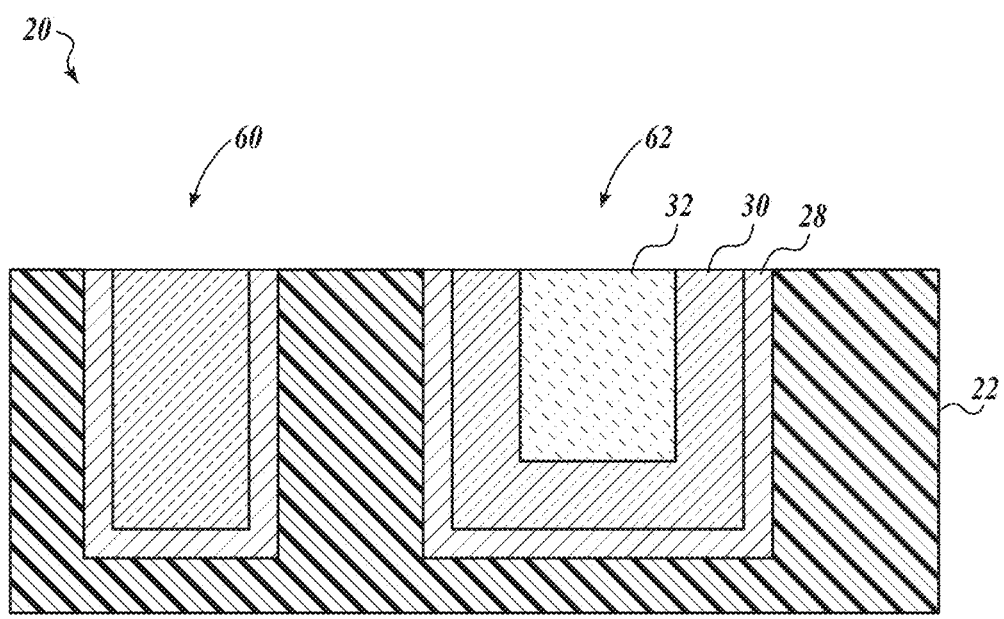

Referring to FIG. 1F, the workpiece is then subjected to a chemical-mechanical planarization (CMP) process to fabricate the device.

In accordance with embodiments of the present disclosure, the processes described herein may include a post-CMP anneal to promote crystal growth, to stabilize and lower the resistivity of the films, and to seal any remaining microvoids and seams.

Figure 6:
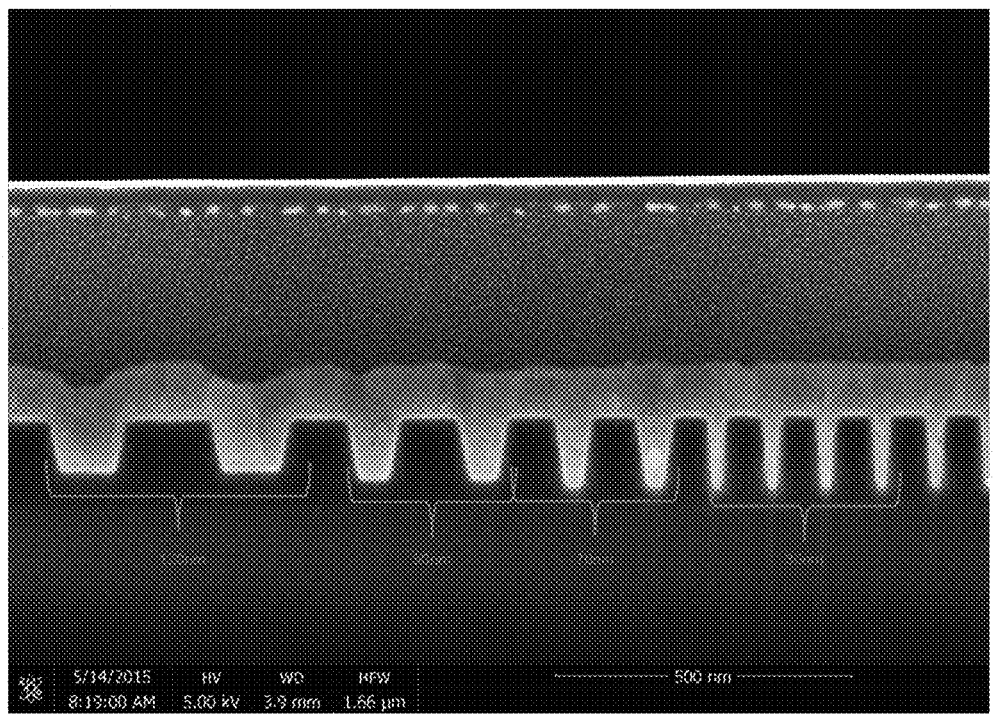
FIG. 6 is an SEM image showing fill of small features with cobalt and large features with copper, in accordance with one embodiment of the present disclosure.

In one exemplary embodiment of FIGS. 1A-1F, the small feature is completely filled with CVD cobalt or nickel and the larger feature includes a CVD cobalt or nickel seed, but is filled with ECD copper. Referring to an exemplary process in the EXAMPLE below, an SEM image in FIG. 6 showing several features of different sizes on a workpiece, cobalt or nickel fills the smaller features (e.g., less than or equal to 17 nm) and a cobalt/nickel and copper stack fills the larger features (e.g., greater than 20 nm).

Figure 4:
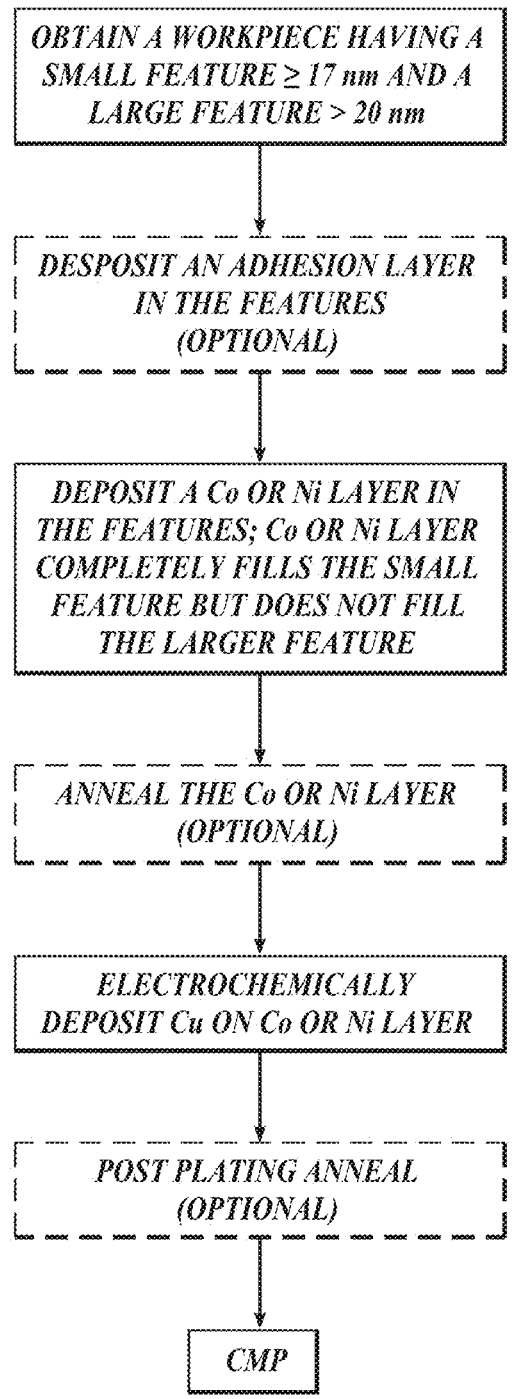
FIGS. 4 and 5 are flow diagrams depicting exemplary processes in accordance with embodiments of the present disclosure.

Referring to FIG. 4, an exemplary process in accordance with one embodiment of the present disclosure includes obtaining a workpiece having a small feature (critical dimension less than or equal to 17 nm) and a large feature (critical dimension greater than 20 nm). The process includes optionally depositing an adhesion layer in the features. The process includes depositing a Co or Ni layer in the features, wherein the Co or Ni layer completely fills the small feature but does not fill the large feature. The process includes optionally annealing the Co or Ni layer. The process includes electrochemically depositing Cu on the Co or Ni layer, and optionally annealing the workpiece after ECD deposition. After the large feature has been filled, the process includes CMP.

In another exemplary process in accordance with one embodiment of the present disclosure, the process includes electrochemically depositing a second metal layer (Cu) on a first metal layer (Co or Ni) on a workpiece having at least two features of two different sizes in a dielectric layer, wherein the first metal layer completely fills the smallest feature but does not completely fill the largest feature.

One advantageous effect of a workpiece including hybrid Co or Ni and Cu metallization is reduced resistance of Co/Ni interconnects as compared to Cu interconnects in smaller features, which results in improved IC performance. The hybrid use of Co or Ni and Cu metallization also provides a means for extending the use of Cu metallization as IC dimensions continue to scale down.

Another advantageous effect is a Co/Ni and Cu stack in the larger features may mitigate the expected high resistance in large and long lines that are filled with only Co or Ni metal.

Another advantageous effect is the use of a Co/Ni and Cu stack may reduce via resistance, an advantage for high speed devices. Moreover, cobalt can use a thinner liner layer than copper, thus reducing the thickness of a TaN liner (or cladding) in the vias and trenches. Referring to an exemplary workpiece 120 in FIG. 6, an integration of CVD Co in narrow lines 150 and ECD Cu in wide lines 152 is illustrated.

Figure 2A:
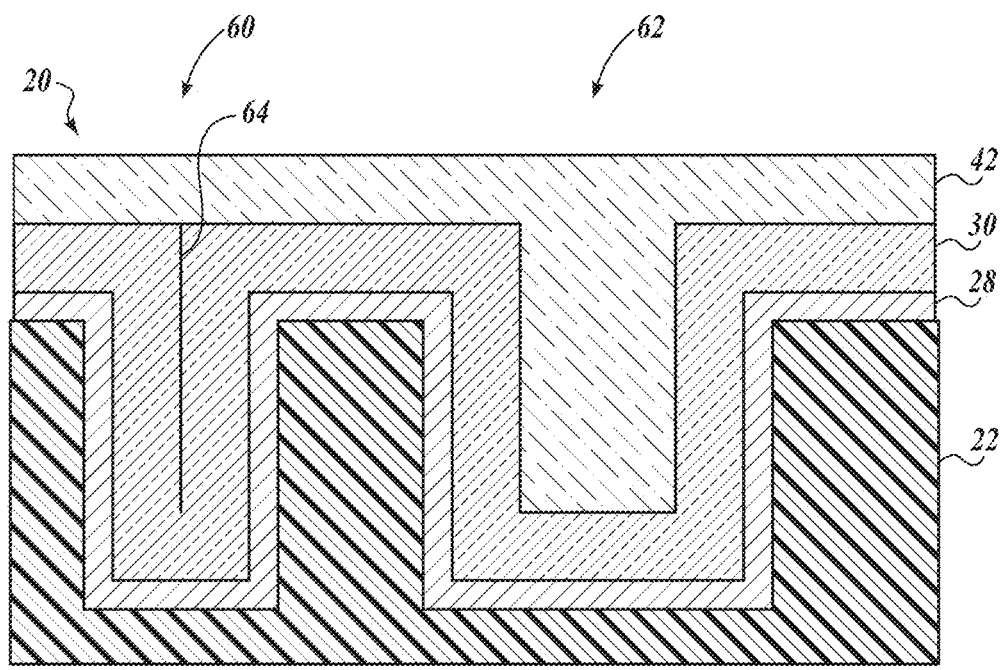
FIGS. 2A-2C are a series of schematic illustrations of a method of forming a interconnects in accordance with another embodiment of the present disclosure.
Figure 2B:
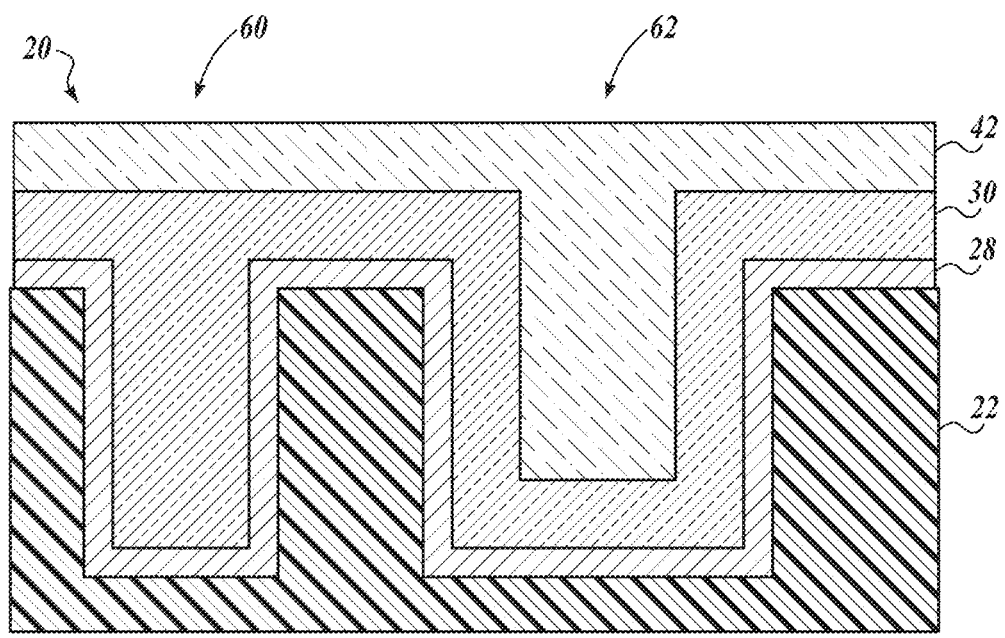
Figure 2C:
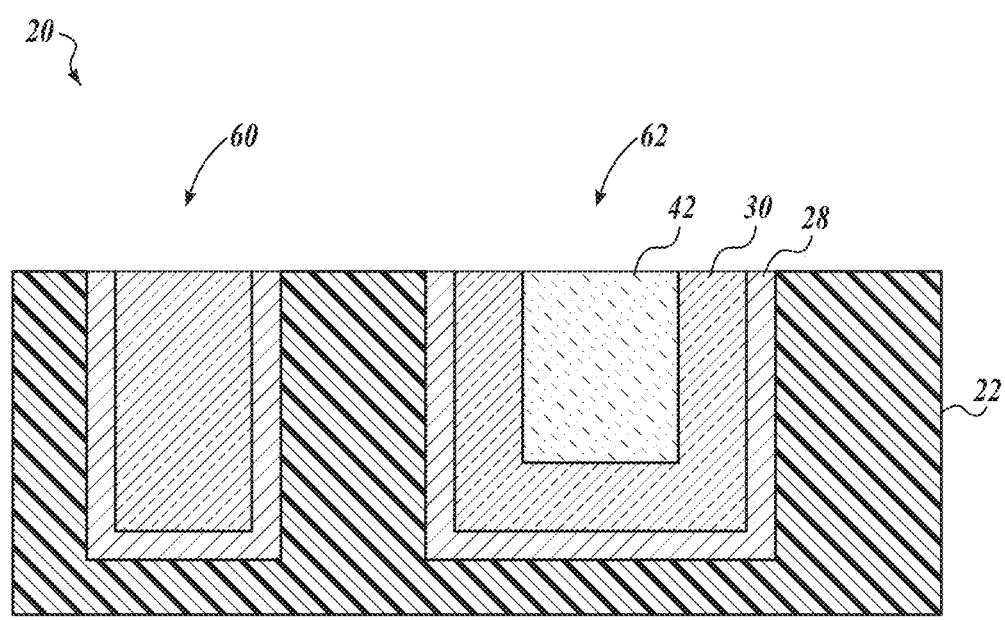

Referring to alternate method in accordance with embodiments of the present disclosure in FIGS. 2A-2C, the larger feature is filled with bottom-up copper metallization 42 (see FIG. 2A), instead of conformal fill as illustrated in FIG. 1D. Bottom-up fill may be achieved with conventional ECD fill and cap techniques in the feature, for example, using an acid deposition chemistry. Conventional ECD copper acid chemistry may include, for example, copper sulfate, sulfuric acid, methane sulfonic acid, hydrochloric acid, and organic additives (such as accelerators, suppressors, and levelers). Electrochemical deposition of copper has been found to be the most cost effective manner by which to deposit a copper metallization layer. In addition to being economically viable, ECD deposition techniques provide a substantially bottom up (e.g., nonconformal) metal fill that is mechanically and electrically suitable for interconnect structures.

Referring to FIG. 2B, the workpiece 20 may be annealed in accordance with methods described above. Such annealing may heal seam 64. With bottom-up or super-conformal fill, annealing of the second metallization layer 42 at temperatures for reflow of the layer 42 to partially or fully fill the second larger feature 62 may not be needed.

Referring to FIG. 2C, the workpiece 20 is subjected to a chemical-mechanical planarization (CMP) process to fabricate the device.

Figure 3A:
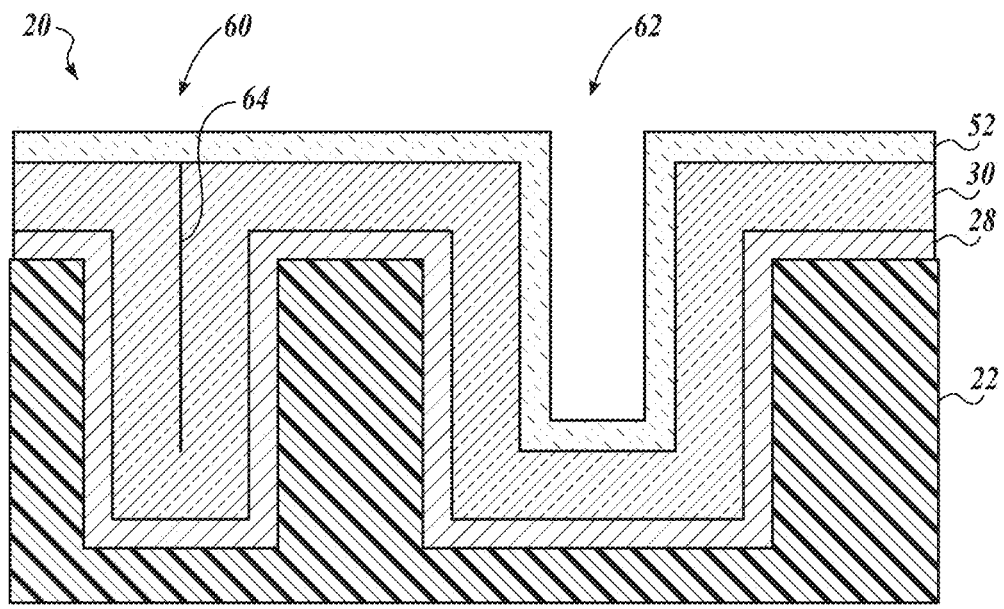
FIGS. 3A-3D are a series of schematic illustrations of a method of forming a interconnects in accordance with another embodiment of the present disclosure.
Figure 3B:
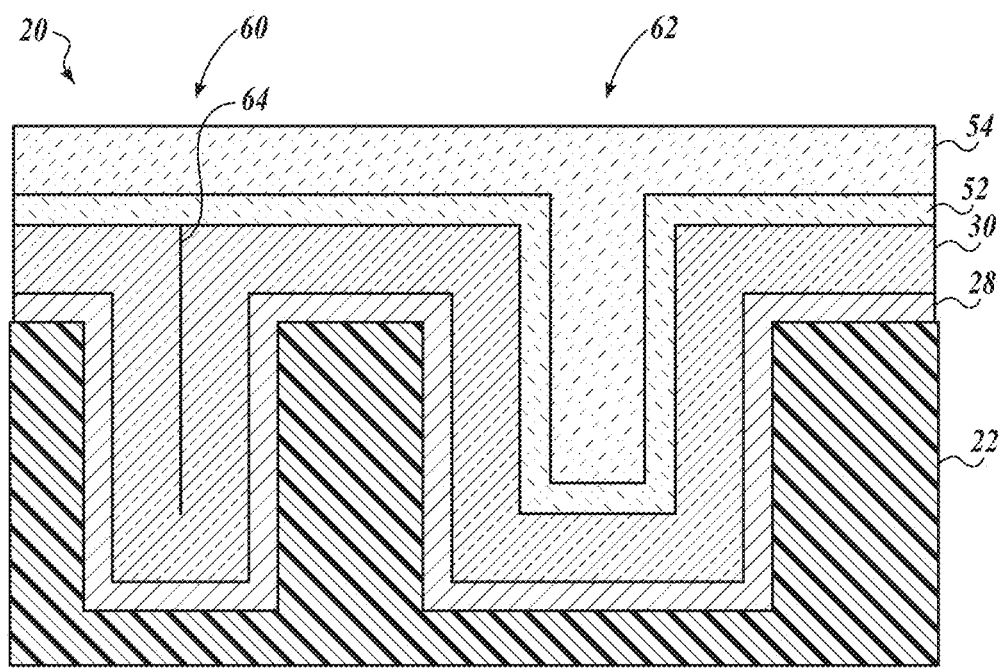
Figure 3C:
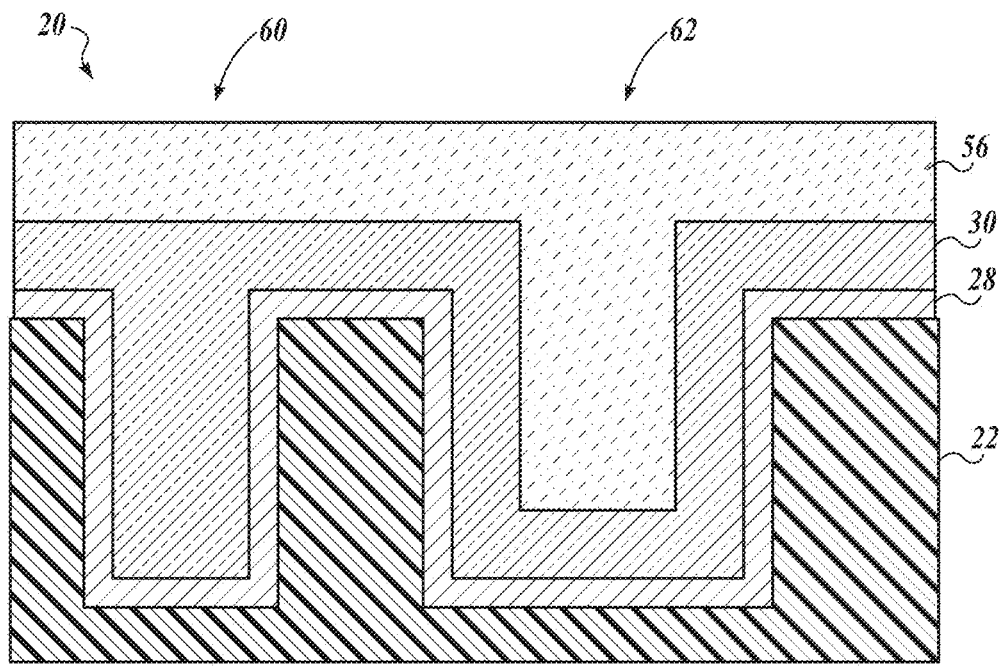

Referring to FIGS. 3A-3C another alternate method in accordance with embodiments of the present disclosure is provided. Referring to FIG. 3A, a copper seed layer 52 is deposited on a cobalt or nickel seed layer 30. The copper seed layer may be deposited by a process selected from the group consisting of physical vapor deposition, chemical vapor deposition, atomic layer deposition, and electro-less deposition Referring to FIG. 3B, the larger feature 62 is filled with bottom-up copper metallization 54. However, in accordance with other embodiments of the present disclosure, the larger feature 62 may be fully or partially filled with conformal or superconformal copper metallization by an electrochemical deposition process.

Referring to FIG. 3C, the workpiece 20 may be annealed in accordance with methods described above. Such annealing may heal seam 64 and meld the first copper seed layer 52 and the second copper metallization layer 54 into one copper layer 56.

Figure 3D:
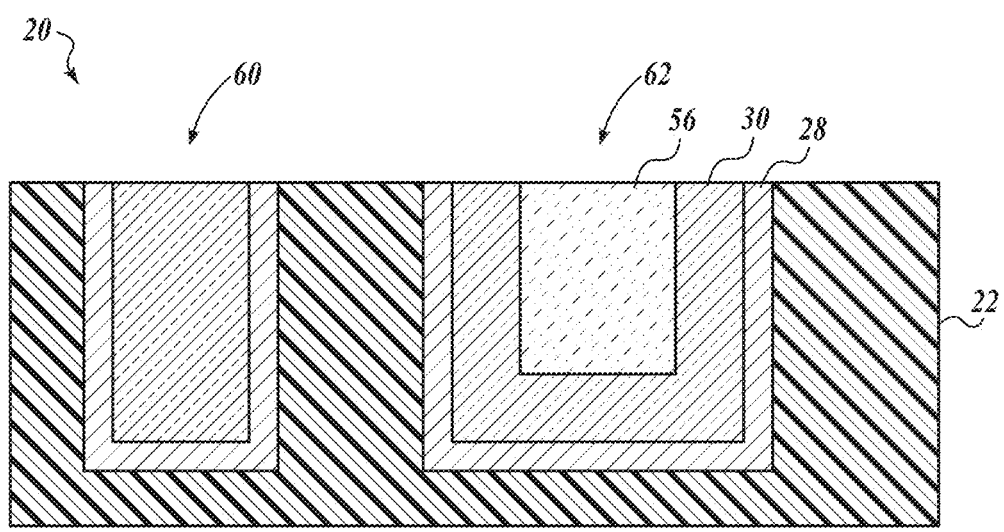

Referring to FIG. 3D, the workpiece 22 is then subjected to a chemical-mechanical planarization (CMP) process to fabricate the device.

Figure 5:
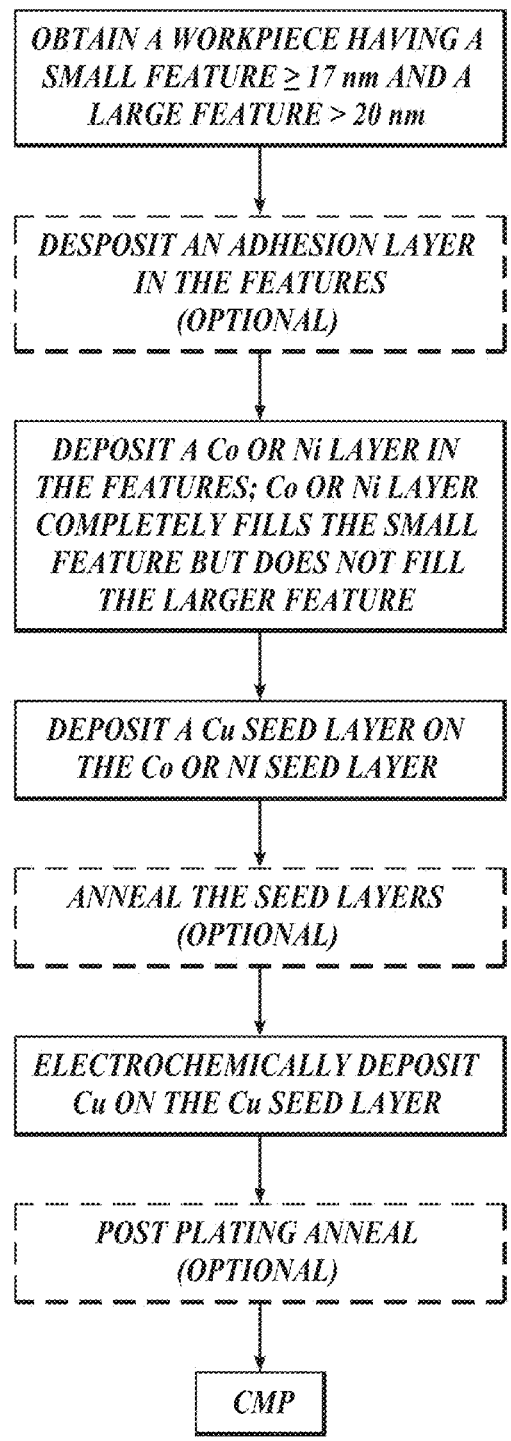

Referring to FIG. 3A-3C and the flow diagram of FIG. 5, an exemplary process in accordance with one embodiment of the present disclosure includes obtaining a workpiece having a small feature (critical dimension less than or equal to 17 nm) and a large feature (critical dimension greater than 20 nm). The process includes optionally depositing an adhesion layer in the features. The process includes depositing a Co or Ni seed layer in the features, wherein the Co or Ni layer completely fills the small feature but does not fill the large feature. The process includes depositing a Cu seed layer on the Co or Ni seed layer. The process includes optionally annealing the seed layers. The process includes electrochemically depositing Cu on the Cu seed layer, and optionally annealing the workpiece after CCD deposition. After the large feature has been filled, the process includes CMP.

In another exemplary process in accordance with one embodiment of the present disclosure, the process includes electrochemically depositing on second metal layer (Cu) on a seed layer stack of a first seed layer (Co or Ni) and a second seed layer (Cu) on a workpiece having at least two features of two different sizes in a dielectric layer, wherein the first seed layer completely fills the smallest feature but does not completely fill the largest feature.

Figure 7:
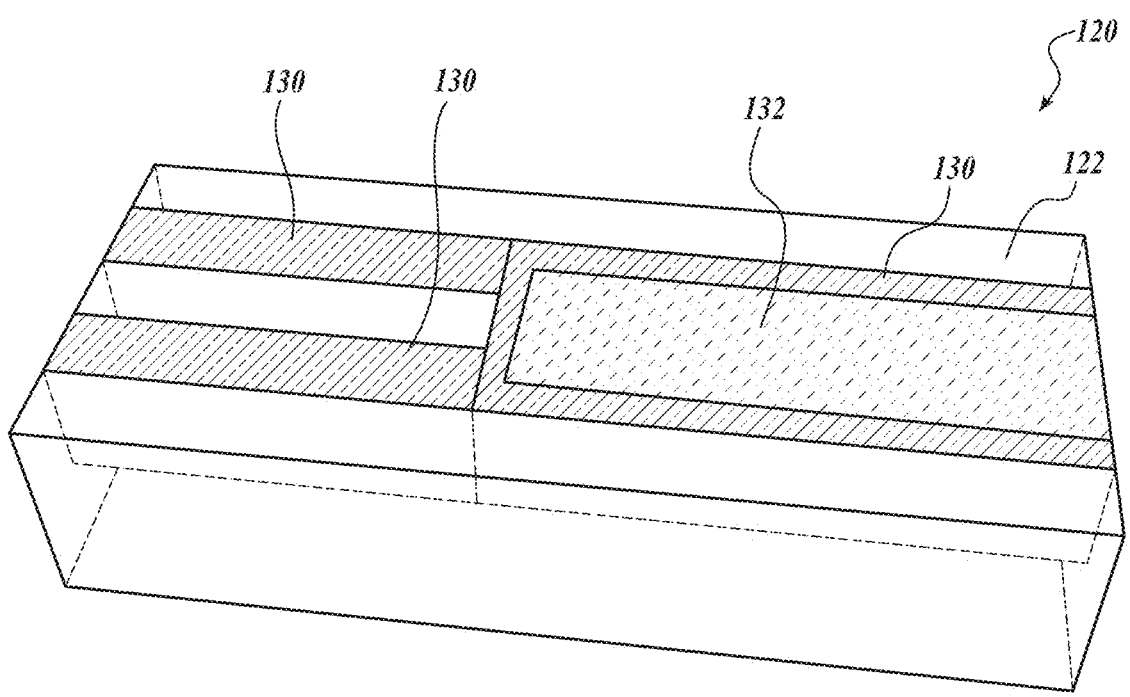
FIG. 7 is a three-dimensional schematic illustration depicting an exemplary workpiece in accordance with one embodiment of the present disclosure.

Referring to FIG. 7, a three-dimensional schematic of a workpiece 120 in accordance with embodiments of the present disclosure is illustrated. The workpiece 100 includes a substrate 122. A second metal layer 132 (Cu) is deposited on a first metal layer 130 (Co or Ni) on a workpiece having at least two features of two different sizes in a dielectric layer, wherein the first seed layer completely fills the smallest feature 160 but does not completely fill the largest feature 162.

EXAMPLE

Two wafers were obtained. On the wafer 30 Å of PVD TaN and 100 Å of CVD Co were deposited. The wafers were annealed at 400° C. for 5 minutes. The wafers were transferred to a nitrogen-purged FOUP to mitigate oxidation of the Co layer. The wafers plated using ECD Cu Seed chemistry at a pH of 9.3. A two-step plating process was used at 2 Amin and annealed at 250° C. for 1 minute. FIG. 4 is flow diagram for the process described in this example. An SEM cross-section in FIG. 6 shows Co fill of the small features and Co/Cu stack in the large features.

Treatment with Hydrogen Plasma

Seed layers have a tendency to oxidize, and such oxidation may degrade subsequent metal deposition on the seed layer. In addition, an oxidized surface tends to increase defects and may degrade the reliability of the interconnect. A high temperature anneal of the seed layer in a reducing atmosphere tends to reduce such oxides. The oxides can be further reduced prior to metal deposition, for example, by plasma treatment either before, or during, or after the high-temperature anneal. In accordance with embodiments of the present disclosure, anneal and plasma treatment steps may be performed in different chambers or in the same chamber, either simultaneously or in sequence.

Figure 8A:
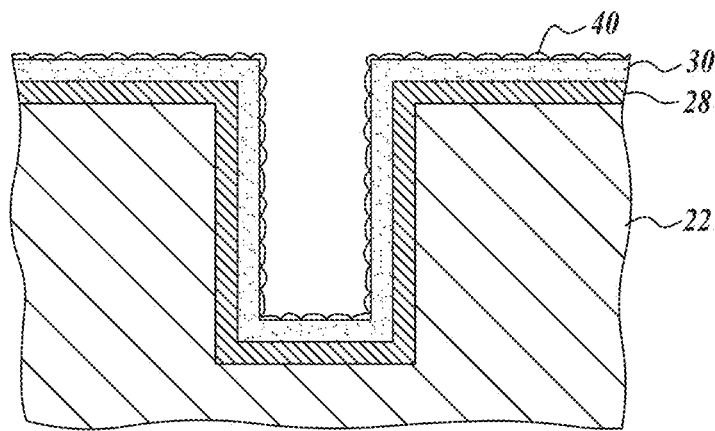
FIGS. 8A-8C are a series of schematic illustrations of a method of removing oxides and/or other contaminants from a seed layer in accordance with embodiments of the present disclosure.
Figure 8B:
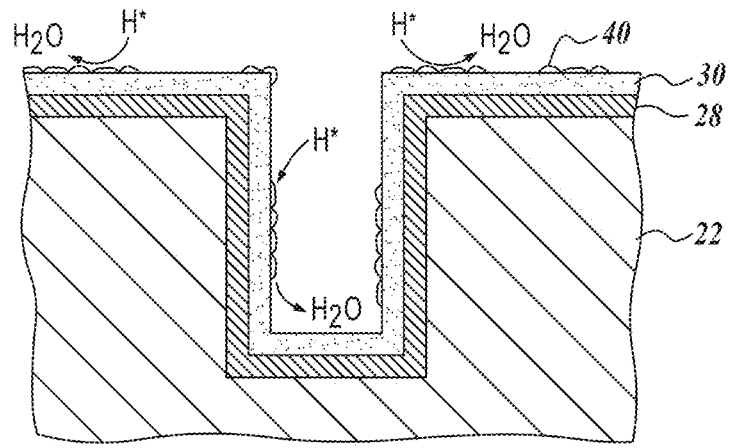
Figure 8C:
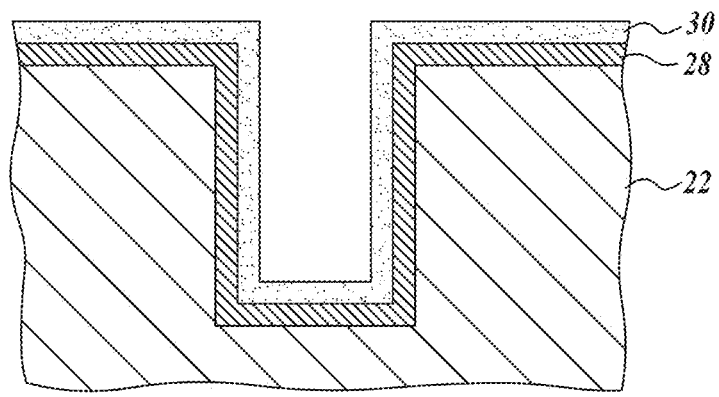

In accordance with embodiments of the present disclosure, surface treatment can be achieved using a low temperature surface treatment method so as to maintain the integrity and continuity of the deposited seed layer and minimize damage to the seed layer. Referring to FIGS. 8A-8C, in one embodiment of the present disclosure, the seed layer 30 is treated with hydrogen radicals H*. The hydrogen radicals H* is used to reduce metal oxides back to metal and covert the oxides to water. The hydrogen radical H* can also be used to clean contaminants from the seed layer surface, such as carbon.

In accordance with embodiments of the present disclosure, the hydrogen radicals H* may be generated using a plasma chamber, using a hot-filament radical source, or a combination of both. The hydrogen radicals H* can be used to uniformly reduce oxides 40 and clean the seed layer surface 30 in the feature.

Advantageous effects of hydrogen radical H* surface treatment in accordance with embodiments of the present disclosure include reduced agglomeration of the conductor layers and/or reduced changes to the intrinsic properties of the seed layer were typically caused by high temperature treatments in previously developed processes. Another advantageous effect of surface treatment includes enhances nucleation of the plated conductor as a result of the surface treatment to reduce oxygen and other contaminants.

After surface treatment by hydrogen radicals H*, a short processing window between surface treatment and electrochemical deposition, re-oxidation of the seed layer surface 30 is significantly reduced. Accordingly, in some embodiments of the present disclosure, the time range between seed layer surface treatment and metallization layer deposition is less than 60 seconds. In other embodiments, the time range may be less than 30 seconds. In some embodiments, re-oxidation of the seed layer may be mitigated by storing the workpiece in a nitrogen environment (or another inert environment) before plasma surface treatment, after plasma surface treatment, or during other intervals in workpiece processing.

In some embodiments of the present disclosure, a wet process is used to reduce the oxide layer and further clean the surface of the seed, prior to plating. The wet process typically takes place in the plating bath, between wafer immersion in the bath and the initiation of plating. The wet process may be used with or without the plasma treatment described above. In some embodiments the wet clean process is performed without the preceding plasma treatment, and in those embodiments all oxides and surface contaminants are removed during the wet process. In other embodiments, a plasma treatment precedes the wet clean. In other non-limiting embodiments only plasma treatment is used and plating commences during immersion or immediately afterwards.

In comparison, a typical plating window after a seed deposition process is in the range of about 6-24 hours, generally considered by the industry to be an acceptable time period for plating metal on a seed layer. Moreover, cobalt seed layer surface treatment in accordance with the processing methods described herein may have the effect of improving adhesion, reducing defects, improving interconnect reliability, and other properties for subsequent cobalt metallization layers.

Figure 9:
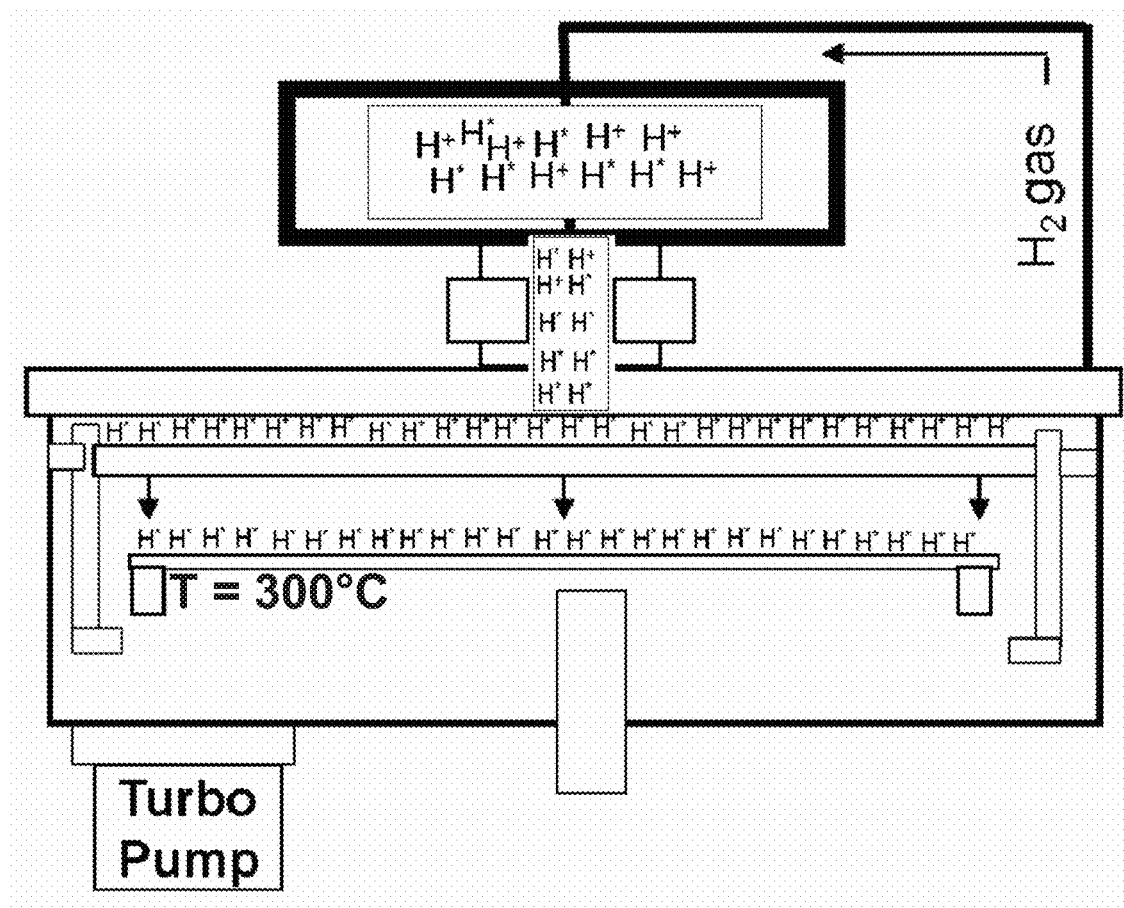
FIG. 9 schematically illustrates a hydrogen ion plasma chamber for use with methods in accordance with embodiments of the present disclosure.

Referring to FIG. 9, an exemplary a hydrogen ion plasma chamber for use with methods in accordance with embodiments of the present disclosure is shown.

Figure 10:
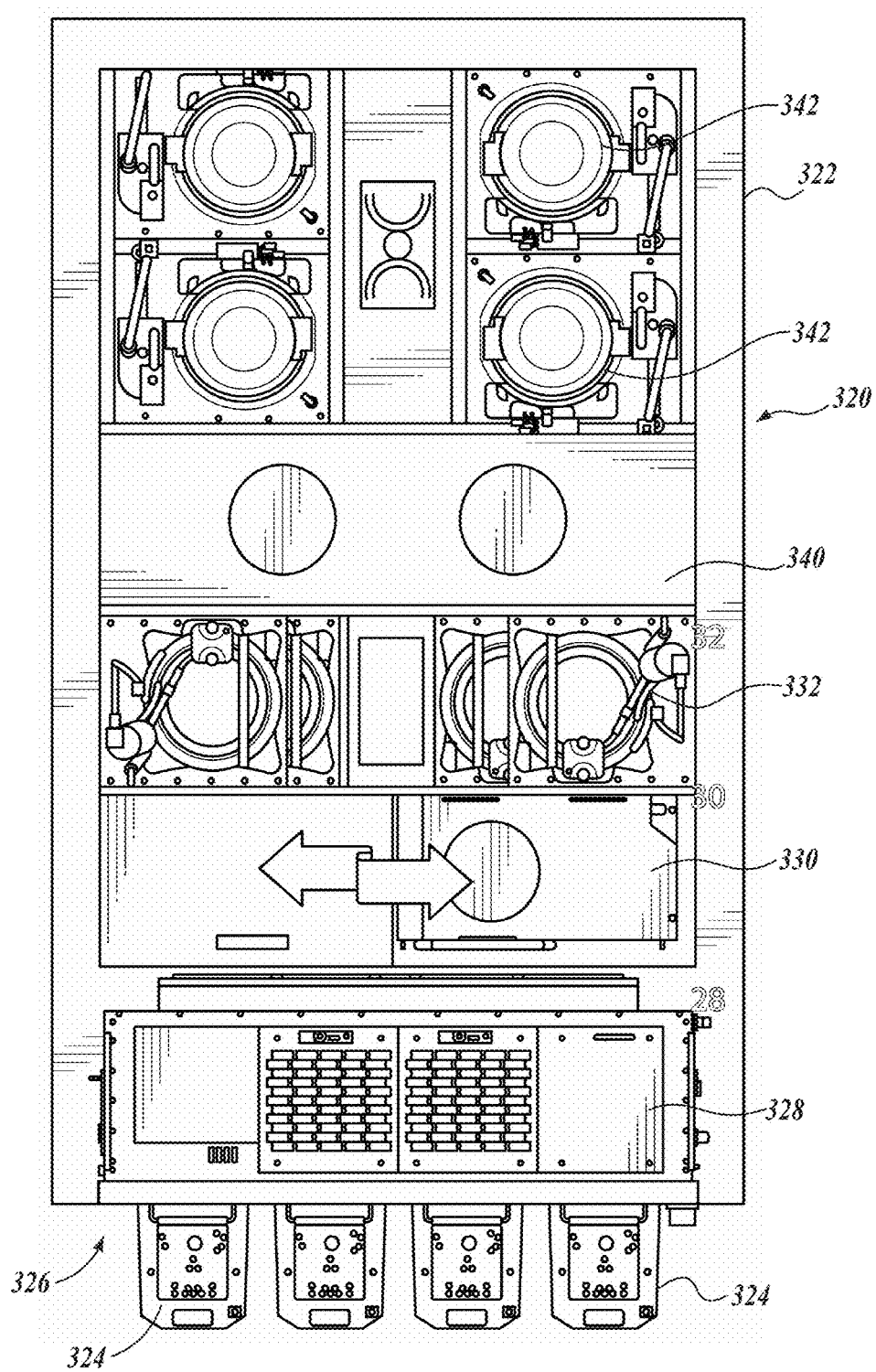
FIG. 10 schematically illustrates an electrochemical deposition plating tool for use with methods in accordance with another embodiment of the present disclosure.

To achieve the short processing window, advances have been made to the plating tool. Referring to FIG. 10 an exemplary plating tool for use with methods described herein in shown, commonly known as the MUSTANGS tool manufactured by APPLIED Materials, Inc. The tool of FIG. 10 includes modules or subsystems within an enclosure 322. Wafer or substrate containers 324, such as FOUP (front opening unified pod) containers, may be docked at a load/unload station 326 at the front of the enclosure 322. The subsystems used may vary with the specific manufacturing processes performed by the system 320. In the illustrated embodiment, the system 320 includes a front interface 328 which may provide temporary storage for wafers to be moved into or out of the system 320, as well as optionally providing other functions. As non-limiting examples, the system 320 may include an anneal module 330, a hydrogen radical H* generation chamber, a rinse/dry module 332, a ring module 340, and electroplating chambers 342, which may be sequentially arranged within the enclosure 322 behind the front interface 328. Robots move the wafers between the subsystems.

In some embodiments of the present disclosure, the tool may have an ambient air environment between chambers. In other embodiments, the tool may have a nitrogen environment in the enclosure between chambers to mitigate oxidation of the seed layer before plasma surface treatment, after plasma surface treatment, or during other intervals in workpiece processing.

In some embodiments of the present disclosure, the tool may include separate annealing and hydrogen radical H* generation chambers. In other embodiments of the present disclosure, the hydrogen radical H* generation may occur in the same chamber as is used for an annealing process. Although the same chamber may be used for both processes, the processes will occur separately in the workpiece manufacturing process, and not at the same time. To accommodate both processes, the chamber will have both hydrogen radical H* generation capabilities and annealing capabilities. In one embodiment, the chamber accommodates a temperature range from room temperature to 300° C.; or room temperature to 400° C.

The combination of hydrogen radical H* generation and annealing in one processing chamber reduces that manufacturing site foot print of the tool and provides for annealing at high temperature and high vacuum, which may prove to be of benefit to the seed layer.

The metal options of the seed and metallization layers are described above. Embodiments of the present disclosure include, for example, a cobalt or nickel seed layer and a copper metallization layer.

While illustrative embodiments have been illustrated and described, it will be appreciated that various changes can be made therein without departing from the spirit and scope of the disclosure.

The embodiments of the invention in which an exclusive property or privilege is claimed are defined as follows:

1. A microfeature workpiece, comprising:
    at least two features of two different sizes disposed in a dielectric:
    wherein a width of a first feature of the at least two features is less than or equal to 17 nm, and wherein a width of a second feature of the at least two features is greater than 20 nm; and
    a first metal layer disposed on the microfeature workpiece, the first metal layer comprising a metal selected from the group consisting of cobalt and nickel, the first metal layer completely filling the first feature of the at least two features and not completely filling the second feature of the at least two features; and
    a second metal layer electrochemically deposited on the microfeature workpiece, wherein the second metal layer is a copper layer that stack fills in the first metal layer of the second feature of the at least two features.

2. The microfeature workpiece of claim 1, wherein the microfeature workpiece has been heat treated after deposition of the second metal layer.

3. The microfeature workpiece of claim 2, wherein the first and second metal layers have been annealed by the heat treating.

4. The microfeature workpiece of claim 2, wherein the second metal layer has reflowed due to the heat treatment to at least partially fill the second feature of the at least two features.

5. The microfeature workpiece of claim 1, wherein the first metal layer has been plasma treated using hydrogen plasma or hydrogen radicals (H*) prior to electrochemically depositing the second metal layer.

6. The microfeature workpiece of claim 1, wherein the first metal layer has been heat treated before depositing the second metal layer.

7. The microfeature workpiece of claim 1, wherein the second metal layer is a conformal or superconformal layer.

8. The microfeature workpiece of claim 1, wherein the second metal layer includes an overburden.

9. The microfeature workpiece of claim 1, wherein the second feature of the at least two features has been partially filled by the second metal layer without depositing an overburden on the microfeature workpiece.

10. The microfeature workpiece of claim 1, further comprising a third metal layer electrochemically deposited on the second metal layer.

11. The microfeature workpiece of claim 10, wherein the third metal layer is one or more of an overburden, a cap, a fill layer, a conformal conductive layer, or a superconformal conductive layer.

12. The microfeature workpiece of claim 1, wherein the first metal layer is a first seed layer.

13. The microfeature workpiece of claim 12, wherein a second seed layer is disposed on the first seed layer.

14. The microfeature workpiece of claim 13, wherein the second seed layer is different in metal composition from the first seed layer.

15. The microfeature workpiece of claim 13, wherein the second seed layer is a copper seed layer.

16. The microfeature workpiece of claim 1, wherein the second metal layer is deposited over an entire surface of the first metal layer.

17. The microfeature workpiece of claim 1, wherein the second metal layer is a bottom-up fill layer.

18. The microfeature workpiece of claim 1, wherein the microfeature workpiece includes an adhesion or barrier layer in the at least the two features between the dielectric and the first metal layer.

19. The microfeature workpiece of claim 1, wherein the cobalt or nickel in the first feature of the at least two features has been reflowed.

20. The microfeature workpiece of claim 1, wherein the cobalt or nickel in the first feature of the at least two features and the stack layer of cobalt or nickel and copper in the second feature of the at least two features has been reflowed.

21. The microfeature workpiece of claim 1, wherein the first and second features of the at least two features include an overburden.

22. The microfeature workpiece of claim 2, wherein heat treatment of the microfeature workpiece occurred in a temperature range of 150 degrees C. to 400 degrees C.

* * * * *